United States Patent
Nguyen et al.

[11] Patent Number: 6,097,664
[45] Date of Patent: Aug. 1, 2000

[54] MULTI-PORT SRAM CELL ARRAY HAVING PLURAL WRITE PATHS INCLUDING FOR WRITING THROUGH ADDRESSABLE PORT AND THROUGH SERIAL BOUNDARY SCAN

[75] Inventors: Bai Nguyen; Bradley A. Sharpe-Geisler, both of San Jose; Herman M. Chang, Cupertino; Om P. Agrawal, Los Altos, all of Calif.

[73] Assignee: Vantis Corporation, Sunnyvale, Calif.

[21] Appl. No.: 09/235,356

[22] Filed: Jan. 21, 1999

[51] Int. Cl.[7] .................................................. G11C 8/00
[52] U.S. Cl. ...................... 365/230.05; 365/154; 365/221
[58] Field of Search .............................. 365/230.05, 154, 365/221, 129, 189.01, 230.01

[56] References Cited

U.S. PATENT DOCUMENTS

| | | |
|---|---|---|
| 4,757,477 | 7/1988 | Nagayama et al. ................ 365/230.05 |
| 5,442,770 | 8/1995 | Barratt ................................ 711/3 |
| 5,452,259 | 9/1995 | McLaury .......................... 365/230.05 |
| 5,654,773 | 8/1997 | Kajimoto et al. ................. 348/717 |
| 5,787,007 | 7/1998 | Bauer ................................ 364/489 |

*Primary Examiner*—David Nelms
*Assistant Examiner*—Hoai V. Ho
*Attorney, Agent, or Firm*—Fliesler, Dubb, Meyer & Lovejoy LLP; Gideon Gimlan

[57] ABSTRACT

A serial scan chain extends into an array of SRAM cells within a multi-ported memory system for allowing serial introduction of write data into the SRAM cells and serial read-back of the data. Initial data may be pre-loaded into the SRAM cells by way of the serial scan chain before being read parallel-wise in response to read requests submitted through any of multiple, parallel data access ports of the system.

32 Claims, 2 Drawing Sheets

200

MULTI-PORT SRAM CELL ARRAY HAVING PLURAL WRITE PATHS INCLUDING FOR WRITING THROUGH ADDRESSABLE PORT AND THROUGH SERIAL BOUNDARY SCAN

BACKGROUND

1. Field of the Invention

The invention relates generally to the field of Static Random Access Memories (SRAM's). The invention relates more specifically to multi-port SRAM arrays.

2b. Cross Reference to Related Applications

The following copending U.S. patent applications are owned by the owner of the present application and their disclosures are incorporated herein by reference:

(A) Ser. No. 08/996,049 filed Dec. 22, 1997 by Om P. Agrawal et al and originally entitled, DUAL PORT SRAM MEMORY FOR RUN-TIME USE IN FPGA INTEGRATED CIRCUITS.

3. Description of the Related Art

Static Random Access Memory cells (SRAM cells) have bi-stable storage loops that can store data without need for periodic refresh. Because of this, SRAM cells can be used for outputting stored data at relatively high speed. In contrast, Dynamic Random Access Memory cells (DRAM cells) require periodic refreshing of their capacitively-stored data. This need for periodic refreshing may prevent DRAM systems from providing read information immediately upon request.

As such, SRAM cell arrays are often used for servicing high-speed, digital storage functions. Even though comparative DRAM arrays generally have lower per-bit cost and lower per-per-cell size as compared to that of SRAM cell arrays, the refresh-free aspect of SRAM cell arrays makes the latter more attractive for certain applications.

There is a subset of applications wherein the data of an SRAM array is simultaneously shared by a plurality of data-requesting circuits. Each such data-requesting circuit may need rapid and independent, data-reading access to a respectively addressed part of the data stored in the shared array. Multiple-port systems have therefore been developed to allow each of plural, data-accessing circuits to independently supply a read address to a shared SRAM cell array for the purpose of quickly retrieving its desired data.

It is desirable to be able to also write initial and revised data into the shared SRAM array. However, the multi-port nature of a shared SRAM array raises special problems because contention may occur if multiple ports simultaneously try to write to a same memory area. Another problem with multi-port SRAM systems is that the paths for multiple and independent write circuits may consume excessive circuit space. A particular arrangement is disclosed herein that allows for multiple and independent write circuits without consuming excessive amounts of additional circuit space.

SUMMARY OF INVENTION

Conventional integrated circuit devices typically include a serial boundary scan system such as JTAG for testing internal circuitry from points outside a packaging of the device. In accordance with the invention, such a serial boundary scan system that includes a crosspoint subsystem can be used for defining at least one write path into a shared SRAM array of a multi-ported SRAM subsystem. The serial boundary scan system can also be used for defining a serial read-back path out of the shared SRAM array.

In one embodiment, only one of plural SRAM ports has addressing write access to the shared SRAM array while remaining ports have read-only addressing access to the shared SRAM array. Thus the possibility of same-address writing contention may be avoided. In the same embodiment, a serial boundary scan portion of the embodiment provides an alternate path for pre-loading the shared SRAM array with initial data and verifying the initially loaded data. Accordingly, special provisions do not have to be added for pre-loading initial data through the circuitry of the one SRAM port that has addressing write access to the shared SRAM array. Also, because the serial boundary scan portion is used for device testing, circuit space is not being excessively consumed by the addition of special circuitry for supporting the pre-loading of initial data into the shared SRAM array.

Other aspects of the invention will become apparent from the below detailed description.

BRIEF DESCRIPTION OF THE DRAWINGS

The below detailed description makes reference to the accompanying drawings, in which.

DETAILED DESCRIPTION

Figure 1:
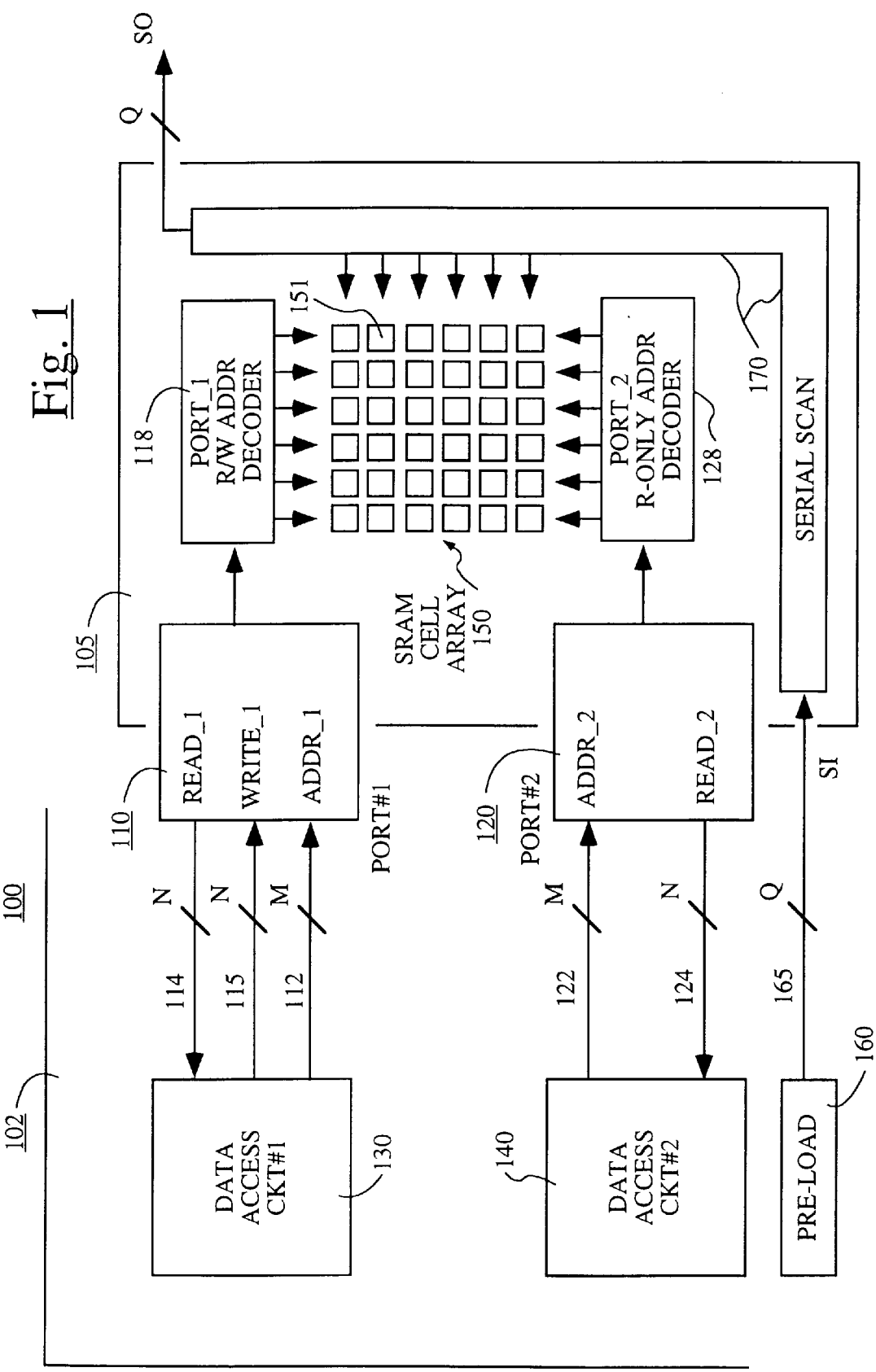
FIG. 1 is a block diagram of a multi-port SRAM subsystem coupled to a plurality of independent data accessing circuits.

FIG. 1 is a block diagram of a system 100 that includes a multi-ported SRAM subsystem 105.

SRAM subsystem 105 may an integral part of a larger integrated circuit monolith 102 having other subsystems integrated therein such as circuits 130 and 140. Alternatively, symbol 102 may represent an encompassing packaging of a multiple chip module (MCM). In yet another embodiment, symbol 102 may represent a printed circuit board on which integrated circuit 102 resides as a first IC package together with other packages represented as circuits 130 and 140. In yet another embodiment, symbol 102 may represent a system housing in which integrated circuit 102 resides as a first IC package housed in housing 102 together with other subsystems such as IC packages or printed circuit boards represented as circuits 130 and 140.

The SRAM subsystem 105 includes an SRAM cell array 150 composed of a plurality of substantially similar SRAM cells, such as cell 151. Multiple access ports such as 110 and 120 are provided in subsystem 105 for allowing each respective one of multiple data accessing circuits (such as 130 and 140) to independently address and read shared data from the common SRAM cell array 150.

In the illustration, the first access port 110 is a combined read/write port that receives respective first address signals (ADDR_1) of M parallel bits each from a first bus 112 having a corresponding plurality of M parallel lines. Corresponding read data (READ_1) signals of N parallel bits each may be output onto a second bus 114 having a corresponding plurality of N parallel lines. Alternatively, in association with supplied address signals (ADDR_1), write data signals (WRITE_1) of N parallel bits each may be input into the first port 110 from a third bus 115 having a corresponding plurality of N parallel lines. If desired, the address, read, and write signals of buses 112, 114 and 115 may be time-multiplexed onto a shared address/data/control bus. Control signals for indicating when each of the address, read and write signals are valid and for controlling the data direction of first port 110 are not shown so that the invention described herein can be seen more clearly.

In one set of embodiments, the width, N of the read and write data signals (READ_1, WRITE_1) is 4 or more bits while the width, M of the Port#1 address signals (ADR_1) is 5 or more bits.

In the illustration, the second access port 120 is a read-only port that has respective means for receiving second address signals (ADDR_2) of M parallel bits each from a fourth bus 122 having a corresponding plurality of M parallel lines and for outputting corresponding read data signals (READ_2) of N parallel bits each onto a fifth bus 124 having a corresponding plurality of N parallel lines. If desired, the address, read, and write signals of buses 122 and 124 may be time-multiplexed onto a shared address/data/control bus. Control signals for indicating when each of the address and read signals of Port#2 are valid are not shown so that the invention described herein can be seen more clearly.

The ADDR_2 signals of the second port 120 are directed to a PORT_2 READ-ONLY DECODER circuit 128 which decodes the received address signals of that port 120 and provides corresponding read-only access to the addressed memory cell or cells of array 150. Similarly, ADDR_1 signals of the first port 110 are directed to the illustrated PORT_1 R/W ADDR DECODER circuit 118 for respective decoding. The first port decoder circuit 118 provides corresponding, read and write access to an addressed one or more of the memory cells in array 150.

A serial scan subsystem 170 is further provided in accordance with the invention and coupled to SRAM cell array 150 for providing an alternative path for writing data into SRAM cell array 150 and optionally reading-back the stored data for verification purposes. The serial scan subsystem 170 has a serial input that is Q lines wide for receiving serially-supplied signals. Q is a whole number equal to at least one, but may be larger, such as 2 or 4 wires. Q, however, is preferably smaller than the sum, N+M. In one embodiment, the Q serial input lines of scan subsystem 170 conform to an industry-standardized, serial scan protocol such as JTAG for example. The serial scan subsystem 170 serially propagates SI input signals to various parts of SRAM subsystem 105 and/or various parts of encompassing element 102. The serially propagated SI input signals may then be transferred in parallel or otherwise to the various parts with the strobing of an appropriate transfer-enable signal. At least part of the serially propagated SI input signals may be written into adjoining SRAM cells. Scan test data may also be loaded into the scan chain in parallel or otherwise from the various parts of system 100 with the strobing of an appropriate, further transfer-enable signal. The captured test data may then be serially propagated out of the boundary of SRAM subsystem 105 and/or out of the boundary of encompassing element 102 as SO output signals for external analysis, where such analysis can include verification of the data loaded into memory array 150.

It is understood that for embodiments where encompassing element 102 is a packaging for an IC or MCM, a relatively small number of package leads (e.g., 4 or less for SI, SO, SCLK, STROBE) may serve as either dedicated or time-multiplexed connections for supporting serial-input (SI), serial output (SO), serial transmission (SCLK) and parallel load (STROBE) functions of the serial scan subsystem 170. Other package leads may therefor be used for supporting high-speed parallel data exchanges as desired.

Each of the data access circuits 130 and 140 may operate independently of the other. It is therefore possible for the first data access circuit 130 to be performing a read or write operation to SRAM subsystem 105 while the second data access circuit 140 is not using subsystem 105. It is possible for circuit 130 to be performing a data write operation to one area of SRAM cell array 150 using the N-bit wide bandwidth of first port 110 while the second access circuit 140 is performing a data read operation from another part of array 150 using the N-bit wide bandwidth of second port 120.

It is further possible for both of data access circuits 130 and 140 to be simultaneously reading data from same or different portions of SRAM cell array 150. Under this condition, the 2N-bit wide, data-reading bandwidth of SRAM cell array 150 is being used to its fullest. And generally speaking, the ability to have such full bandwidth reading of shared data is a good thing because SRAM storage technology is generally selected instead of DRAM so as to take advantage of the refresh-free bandwidth of the SRAM cell array 150.

In some instances, it is desirable to load an initial data set into SRAM cell array 150 during a first time period when SRAM response speed does not have to be relatively high (e.g., does not require the 2N-bit wide, data-reading bandwidth) and to later use the pre-loaded, initial data set during a second time period when SRAM response speed does have to be substantially greater than that of the first time period. An example of such an instance may be the initial configuration and subsequent use of an embedded-memory FPGA device (Field Programmable Gate Array) such as disclosed in the above cited, U.S. application Ser. No. 08/996,049 and whose disclosure is incorporated herein by reference.

In such instances, the serial boundary scan subsystem 170 may be used for serially pre-loading the initial data set during the first time period from pre-load circuit 160 and by way of serial wiring 165. Proper loading of the data may be tested by way of the SO (serial output) part of the boundary scan subsystem 170. One or more of the wires 112, 114, 115 of first port 110; the wires 122, 124 of second port 120; and data access circuit 130 do not need to have special connections made to them for loading the initial data set into SRAM cell array 150 and for testing that SRAM cell array 150 has been correctly programmed in accordance with that initial data set.

This reduction in wiring burdens for pre-loading initial data is particularly advantageous in embodiments where element 102 represents an integrated circuit monolith. Interconnect wiring is a scarce resource in modern integrated circuits. For example, in the FPGA devices described in the above cited, U.S. application Ser. No. 08/996,049, programmably configurable, signal routing lines are better put to use for routing high speed signals such as may pass between SRAM subsystem 105 and in-chip circuits 130, 140 rather than being used for carrying the lower speed, pre-load data.

Also, because some form of serial boundary scan subsystem is generally included in modern integrated circuits for performing testing, the extended use of scan subsystem 170 for loading initial data into SRAM cell array 150 does not add an excessive of amount circuitry for the pre-load function and does not consume an excessive of amount of additional space from the IC 102.

Figure 2:
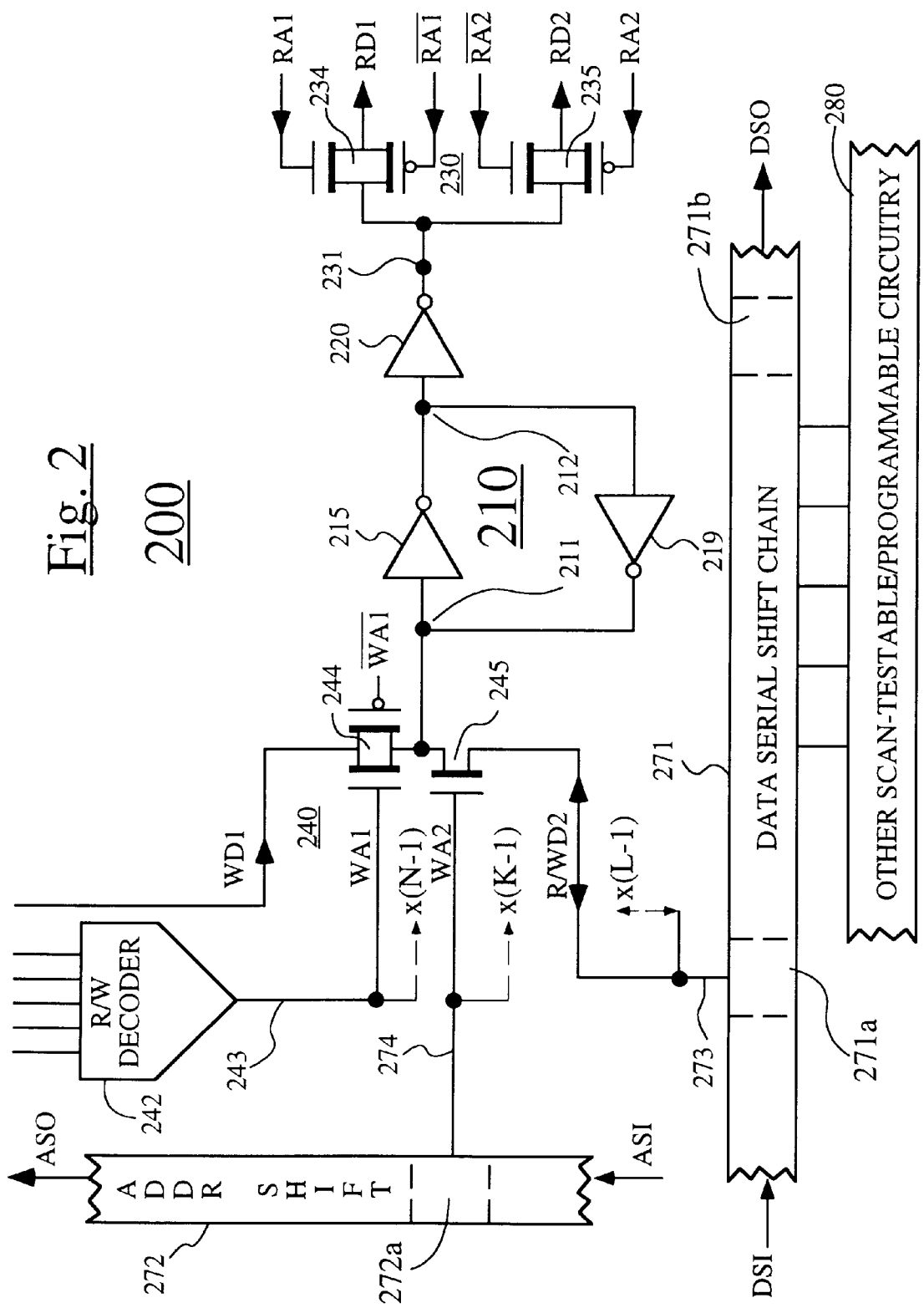
FIG. 2 is a schematic diagram of a multi-port SRAM cell which includes a coupling to a crosspoint-type serial scan subsystem in accordance with the invention.

Referring to FIG. 2, a schematic is shown of one instance 200 in accordance with the invention of a repeated SRAM cell (e.g., 151 of FIG. 1) and adjoining crosspoint portions 271, 272 of a serial boundary scan subsystem such as 170 of FIG. 1. Portions 271 and 272 can be parallel and independent scan chains or serial parts of a common scan chain. Portion 271 functions at least to serially propagate write data, and optionally to further, serially propagate read-back data. Portion 272 functions at least to serially propagate address signals. In one mode of operation, a single logic one that is embedded within a plurality of logic zeroes marches up portion 272 so as to selectively activate one row of crosspoints at a time.

The illustrated SRAM cell 200 consists of five addressable transmission gates or pass transistors (234, 235, 244, 245) and three inverters (215, 219, 220). This is merely an example. It is possible to practice the invention using SRAM cells that have fewer or more components. For example, inverter 220 is not necessary for the practice of the invention disclosed herein. However, inverter 220 may advantageously serve as an isolation buffer 220 for blocking read-address noise.

In the present description, the generic notation of $N(W_{Drawn}/L_{Drawn}$ in microns) will be occasionally used to specify NMOS transistors in accordance with the invention and that of $P(W_{Drawn}/L_{Drawn})$ will be similarly used for PMOS transistors in accordance with the invention. Because in many instances, the drawn gate $L_{Drawn}$ is $0.25\mu$, the shorthand notation N(X/.) or P(X/.) will be used for each transistor which has a $L_{Drawn}$ dimension of $0.25\mu$ and a $W_{Drawn}$ of value X. The output section of CMOS logic gates have both PMOS and NMOS transistors, and as such, their configuration will be indicated by the shorthand notation, P(X/Y):N(X'/Y'); where X, Y, X', Y' are filled in as appropriate numbers of microns. A similar notation will be used for CMOS transmission gates.

SRAM cell 200 comprises a bi-stable loop 210 formed by the back-to-front connection of first CMOS inverter 215 and second CMOS inverter 219. The bi-stable loop 210 has a first node 211 for receiving write data and a second node 212 for outputting read data.

The second inverter 219 is weaker than the first inverter 215 so that the binary state of loop 210 can be easily flipped by introducing an appropriate flipping voltage at write node 211. The flipping voltage overpowers the output of second inverter 219 while simultaneously driving the stronger first inverter 215. The flipped output of first inverter 215 then couples by way of node 212 to the input of second inverter 219. In one embodiment, the specifications for first inverter 215 is P(3/.):N(2.75/.) while the specifications for second inverter 219 is P(3.5/0.375):N(1.5/0.375).

CMOS isolation buffer 220 is provided for transferring read data signals from node 212 of the bi-stable loop 210 to node 231 of a read-directing circuit 230. In one embodiment, the specifications for isolation buffer 220 is P(12.5/.):N(5.5/.).

The read-data directing circuit 230 allows selective and independent reading of the data stored in loop 210 by at least two independent data access ports (e.g., 110 and 120). As seen, the read-data directing circuit 230 includes a first CMOS transmission gate 234 whose N gate receives a read address signal, RA1 and whose P gate receives a complementary first read address signal, RA1* (RA1-bar or RA1-not). When activated, transmission gate 234 outputs a corresponding read output signal, RD1. The data input terminal of transmission gate 234 connects to node 231. Node 231 connects to the output of isolation buffer 220. In one embodiment, the specifications for CMOS transmission gate 234 is P(6/.):N(6/.).

The read-directing circuit 230 further includes a second CMOS transmission gate 235 having a N gate which receives a second read address signal, RA2 and a P gate which receives a complementary second read address signal, RA2* (RA2-bar or RA2-not) Transmission gate 235 outputs a corresponding second read data signal, RD2. In one embodiment, the specifications for CMOS transmission gate 235 is P(6/.):N(6/.).

Although only two read-directing transmission gates, 234–235 are shown for corresponding with respective first and second access ports (110 and 120 of FIG. 1), it is within the contemplation of the invention to have a greater number of such read-directing transmission gates, each corresponding to one of a greater number of access ports.

A write-data directing circuit 240 of the illustrated cell is provided for allowing selective and independent writing of data into loop 210 by at least two independent data sources, one of which is a R/W access port (e.g., 110). As seen, the write-data directing circuit 240 is comprised of a CMOS transmission gate 244 and a N-channel pass transistor 245. The N gate of transmission gate 244 receives the first write address signal, WA1 while its P gate receives the complementary WA1* signal. The data input terminal of transmission gate 244 receives the corresponding write data signal, WD1. In one embodiment, the specifications for CMOS transmission gate 244 is P(6/.):N(6/.).

The gate of pass transistor 245 receives address signal, WA2 while its source receives a corresponding read/write data signal, R/WD2. The data-write output of write-directing circuit 240 connects to node 211 of the bi-stable loop. In one embodiment, the specifications for pass transistor 245 is N(9.25/.). Pass transistor 245 may be used in a bidirectional mode, meaning it can be used for reading data (R/WD2) out of cell 200 as well as writing data into cell 200.

A read/write decoder circuit 242 supplies the WA1 and WA1* address signals to the respective N and P gates of transmission gate 244, WA1 being so coupled for example by way of wire 243. Wire 243 continues on beyond transmission gate 244 to supply the WA1 addressing signal to N-1 more crosspoint transmission gates (not shown) which correspond to crosspoint transmission gate 244 but which reside in a respective plurality of N-1 more memory cells such as cell 200. Accordingly, when the WA1 addressing signal is active, a corresponding plurality of N data bits is selectively output in parallel from the SRAM memory array.

The illustrated read/write decoder circuit 242 has five input lines and thus performs a 5-to-1 decoding function. Larger decoders are of course possible for memory systems with address spaces larger than 32 words. Decoder circuit 242 consumes a finite amount of circuit space within the encompassing SRAM array (e.g., 150 of FIG. 1). The per-cell space overhead for read/write decoder circuit 242 and its wire 243 may be considered equal to the area allocated for that part of the read/write address decoder which is dedicated to wire 243, divided by N.

Address shifting chain 272 (which chain 272 may be composed of a chain of clocked flip-flops, not individually shown) supplies the WA2 address signal to the gate of N transistor 245 by way of wire 274 from a chain subportion identified as 272a. Address shifting chain 272 has a serial input designated as ASI and a serial output designated as ASO. Signals applied at the ASI input propagate serially through chain 272 for output at the ASO output. Wire 274 continues on beyond crosspoint transistor 245 to supply the WA2 addressing signal form chain subportion 272a to K-1 more crosspoint transistors (not shown) which correspond to crosspoint transistor 245 but which reside in a respective plurality of K-1 more memory cells such as cell 200.

Accordingly, when the WA2 addressing signal is active, a corresponding plurality of K data bits may be transferred in parallel between the next-described, data serial shift chain 271 and a corresponding plurality of K memory cells, of which cell 200 is a member.

The per-cell space overhead for serial chain addressing portion 272a and its wire 274 may be considered equal to the area allocated for those parts divided by K. Obviously, as K becomes larger, the per-cell space overhead for parts 272a and 274 becomes smaller.

The R/WD2 data signal can be bidirectionally transmitted between the data shifting chain 271 (which chain 271 may be composed of a chain of clocked flip-flops, not individually shown) and the source/drain of crosspoint transistor 245 by way of wire 273, which wire connects to a chain subportion identified as 271a. Data shifting chain 271 has a serial input designated as DSI and a serial output designated as DSO. Signals applied at the DSI input propagate serially through chain 271 for output at the DSO output. Wire 273 continues on beyond crosspoint transistor 245 to couple a respective R/WD2 data signal between chain subportion 271a and L-1 more crosspoint transistors (not shown) which correspond to crosspoint transistor 245 but which reside in a respective plurality of L-1 more memory cells such as cell 200. While data is being transferred between chain subportion 271a and a first cell such as 200 of a selected matrix row, further data may be simultaneously transferred in parallel between another chain subportion 271b and a second cell (not shown) of the selected matrix row (which row is selected by the WA2 address signal).

Line 273 extends generally orthogonally relative to the extension of line 274. For each of the plurality of K crosspoint transistors (e.g., 245) on line 274 there is a corresponding data-transfer line such as 273. The crosspoint matrix accordingly has a total number of crosspoint nodes defined by the product K·L.

The per-cell space overhead for serial chain data portion 271a and its wire 273 may be considered equal to the area allocated for those parts divided by L. Obviously, as L becomes larger, the per-cell space overhead for parts 271a and 273 becomes smaller. The combined, per-cell space overhead for the K-by-L matrix of crosspoints may be minimized by making K and L roughly equal to one another and by increasing the value of each. In one set of embodiments, each of K and L is a whole number greater than 10. For example, if the memory array has 32 words, each 4 bits wide, the corresponding 128 memory cells may be optimally covered by an 11 by 12 crosspoint matrix.

In addition to reading data from and writing data to a K-by-L matrix of memory cells (of which 200 is a member), the crosspoint address and data shift chains, 272 and 271, may be used for serially scanning data into and reading data back out of other scan-testable and/or programmable circuitry, which circuitry is represented as 280 in FIG. 2.

The above disclosure is to be taken as illustrative of the invention, not as limiting its scope or spirit. Numerous modifications and variations will become apparent to those skilled in the art after studying the above disclosure.

Given the above disclosure of general concepts and specific embodiments, the scope of protection sought is to be defined by the claims appended hereto.

What is claimed is:

1. A multi-port memory system having a plurality of SRAM cells wherein each of said cells comprises:

(a) a bi-stable loop circuit;
    (b) a write-data directing circuit having plural address terminals for receiving respective ones of plural write address signals, and having plural write-data terminals for receiving respective ones of plural write data signals, said write-data directing circuit being coupled to the bi-stable loop circuit for writing received data into the bi-stable loop circuit upon activation of a respective write address signal; and wherein said multi-port memory system further comprises:
    (c) a serial scan subsystem coupled to at least one address terminal and at least one corresponding write-data terminal of each of said SRAM cells for selectively writing serially-transferred data into the bi-stable loop circuits of the respective SRAM cells.

2. The system of claim 1 wherein said bi-stable loop circuit comprises a first inverter and a weaker second inverter coupled to one another to form a bi-stable loop and wherein each of said cells further comprises a third inverter coupled to the bi-stable loop.

3. The system of claim 1 wherein said write-data directing circuit includes:

(b.1) a first transistor having a gate receiving a respective first of the write address signals, a source for receiving a corresponding first write data signal, and a drain for transmitting the corresponding first write data signal to the bi-stable loop circuit; and
    (b.2) a second transistor having a gate for receiving a respective second of the write address signals from said serial scan subsystem, a source for receiving a corresponding second write data signal from said serial scan subsystem, and a drain for transmitting the corresponding second write data signal to the bi-stable loop circuit.

4. A method for use in a multi-port memory system having a plurality of SRAM cells wherein each of said cells has a bi-stable loop circuit and a read-data directing circuit having plural terminals for receiving respective ones of plural read address signals for allowing reading of data stored in said loop circuit in independent response to each of the plural read address signals; said method comprising the steps of:

(a) for each SRAM cell, coupling a serial scan subsystem to the SRAM cell for writing data that has been serially-propagated through the serial scan subsystem into the cell.

5. A data-storing system that includes a multi-port memory subsystem, wherein the memory subsystem has a plurality of data access ports and a plurality of SRAM cells whose data is selectively readable from either of at least two of the data access ports, said data-storing system further comprising:

(a) a serial scan chain extending into the plurality of SRAM cells for transferring serially-propagated write data into the SRAM cells.

6. A data-storing system according to claim 5 wherein said serial scan chain includes:

(a.1) a data shifting subchain for serially-propagating write data; and
    (a.2) an address shifting subchain for serially-propagating a write addressing signal that addresses a subset of the SRAM cells;
    wherein those of the SRAM cells that are addressed by the write addressing signal, are overwritten by corresponding write data of the data shifting subchain when addressed by the write addressing signal.

7. A method for use in a multi-ported memory system having an array of SRAM cells and a serial scan chain extending into said array of SRAM cells; said method comprising the steps of:

(a) pre-loading initial data into the array of SRAM cells by way of the serial scan chain; and (b) after said pre-loading, reading the data stored in the array of SRAM cells in response to read requests submitted through any of multiple data access ports of the multi-ported memory system.

8. An integrated circuit having a memory subsystem wherein said memory subsystem comprises:

(a) an array of SRAM cells;

(b) a first parallel data accessing port operatively coupled to the SRAM array at least for independently addressing and correspondingly reading a plurality of first data bits out in parallel from the SRAM array;

(c) a second parallel data accessing port operatively coupled to the SRAM array for independently addressing and correspondingly reading a plurality of second data bits out in parallel from the SRAM array; and (d) a serial scan chain operatively coupled to the SRAM array for shifting in a plurality of supplied data bits and loading respective ones of the shifted-in data bits into respective cells of the SRAM array.

9. The integrated circuit of claim 8 wherein:

(bc.1) each of the first and second parallel data accessing ports can read out at least a plurality of N data bits in parallel and simultaneously from the SRAM array so that a data read bitwidth of at least 2N bits can be provided by such simultaneous read out, where N is greater than or equal to 4.

10. The integrated circuit of claim 9 wherein:

(b.2) said first parallel data accessing port is further operatively coupled to the SRAM array for selectively writing a plurality of third data bits in parallel into respective cells of the SRAM array, where the written-to cells are selected by said independent addressing of the first parallel data accessing port; and (c.2) said second parallel data accessing port is a read-only port.

11. The integrated circuit of claim 10 and having one or more further parallel data accessing ports each of which is a read-only port.

12. The integrated circuit of claim 10 wherein:

(d.1) said serial scan chain is further operatively coupled to the SRAM array for transferring a plurality of fourth data bits in parallel from respective cells of the SRAM array to the serial scan chain for subsequent shifting out of the SRAM array by way of the serial scan chain.

13. The integrated circuit of claim 8 and further including within said integrated circuit:

(e) a first data accessing circuit operatively coupled to said first parallel data accessing port for supplying first address signals to the first parallel data accessing port and for correspondingly receiving said plurality of first data bits; and (f) a second data accessing circuit operatively coupled to said second parallel data accessing port for supplying second address signals to the second parallel data accessing port and for correspondingly receiving said plurality of second data bits.

14. The integrated circuit of claim 13 and further including within said integrated circuit:

(g) programmably configurable interconnect for routing data signals between said memory subsystem and said first and second data accessing circuits.

15. The integrated circuit of claim 13 wherein said serial scan chain is part of a boundary scan test chain that is usable for scan testing of other circuitry within the integrated circuit.

16. The integrated circuit of claim 13 wherein the integrated circuit is mounted in a printed circuit having further integrated circuits and said serial scan chain is part of a boundary scan test chain that is usable for scan testing of circuitry within said further integrated circuits.

17. The integrated circuit of claim 8 wherein said serial scan chain includes:

(d.1) a first subchain for serially propagating said supplied data bits;

(d.2) a second subchain for serially propagating one or more crosspoint address bits; and (d.3) an array of crosspoint switches each for selectively connecting a respective first point in the first subchain to a respective SRAM cell, where the crosspoint switch is responsive to a respective second point in the second subchain.

18. The integrated circuit of claim 17 wherein each crosspoint switch consists of a pass transistor.

19. The integrated circuit of claim 17 wherein each SRAM cell includes at least first and second transmission gates each for carrying a respective bit of said first and second data bits.

20. The integrated circuit of claim 17 wherein each respective first point connects to a first plurality, L of the crosspoint switches, wherein each respective second point connects to a second plurality, K of the crosspoint switches, and wherein L and K are at least approximately equal to one another.

21. The integrated circuit of claim 17 wherein each of L and K is a respective whole number greater than 10.

22. A method for using an integrated circuit that has a memory subsystem wherein said memory subsystem comprises:

(0.1) an array of SRAM cells;

(0.2) a first parallel data accessing port operatively coupled to the SRAM array at least for independently addressing and correspondingly reading a plurality of first data bits out in parallel from the SRAM array;

(0.3) a second parallel data accessing port operatively coupled to the SRAM array for independently addressing and correspondingly reading a plurality of second data bits out in parallel from the SRAM array; and (0.4) a serial scan chain operatively coupled to the SRAM array for shifting in a plurality of supplied data bits and loading respective ones of the shifted-in data bits into respective cells of the SRAM array;

said using method comprising the steps of:

(a) pre-loading initial data by way of the serial scan chain into the SRAM array;

(b) addressing and correspondingly reading a plurality of first, pre-loaded data bits out in parallel from the first parallel data accessing port; and (c) addressing and correspondingly reading a plurality of second, pre-loaded data bits out in parallel from the second parallel data accessing port.

23. The IC using method of claim 22 and further comprising the step of:

(d) transferring data bits from the SRAM array to the serial scan chain and thereafter shifting the transferred data bits by way of the serial scan chain, out from said integrated circuit.

24. The IC using method of claim 22 wherein said integrated circuit operates in a system having a relatively high-speed mode that is active in a first time period and a comparatively slower-speed mode that is active in a second time period, and wherein:

(a.1) said step of pre-loading initial data occurs in the first time period; and (bc.1) at least one of said steps of addressing and correspondingly reading occurs in the second time period.

25. The IC using method of claim 24 wherein:

(bc.2) both of said step of correspondingly reading from the first parallel data accessing port and of correspondingly reading from the second parallel data accessing port occur simultaneously within the second time period.

26. The IC using method of claim 22 wherein:

(1.1) said integrated circuit further includes programmably configurable logic and programmably configurable interconnect;

(1.2) said integrated circuit has an initial configuration mode and a subsequent use mode;

(a.1) said step of pre-loading initial data occurs during the initial configuration mode; and (bc.1) at least one of said steps of addressing and correspondingly reading occurs during the subsequent use mode.

27. The IC using method of claim 22 wherein:

(0.2a) said first parallel data accessing port is further operatively coupled to the SRAM array for selectively writing a plurality of third data bits in parallel into respective cells of the SRAM array;

(0.3a) said second parallel data accessing port is a read-only port; and said IC using method further comprises the step of:

(d) after said initial data is pre-loaded by way of the serial scan chain into the SRAM array, writing further data bits in parallel into the SRAM array by way of the first parallel data accessing port.

28. The IC using method of claim 27 wherein said memory subsystem further comprises one or more further parallel data accessing ports each of which is a read-only port, and said IC using method further comprises the step of:

(e) after said initial data is pre-loaded by way of the serial scan chain into the SRAM array, invoking a contention-free mode in which only the first parallel data accessing port is used for writing new data into the SRAM array.

29. The IC using method of claim 22 wherein:

(0.4a) said serial scan chain is operatively coupled to further circuitry within the integrated circuit for shifting in test data for said further circuitry and for shifting out test result data; and said IC using method further comprises the step of:

(d) using the serial scan chain for verifying the initial data loaded into the SRAM array.

30. The IC using method of claim 22 wherein:

(0.4a) said serial scan chain includes a serial input line, a serial output line, and a strobing means for receiving a timing signal that defines a time when data should be transferred in parallel between respective parts of the serial scan chain and respective other parts of the integrated circuit;

said IC using method further comprises the step of:

(d) supplying said timing signal to the strobing means for defining a time when storage data should be transferred in parallel between respective parts of the serial scan chain and respective cells of the SRAM array.

31. The IC using method of claim 30 wherein:

(0.4b) said strobing means includes an address bit shift chain; and (d.1) said timing signal includes a logic one that is embedded within a plurality of logic zeroes and marches along the address bit shift chain so as to selectively activate a row of crosspoints, where each of a subset of the crosspoints transfers a respective bit of storage data between respective parts of the serial scan chain and respective cells of the SRAM array.

32. A method for using a housed system that has a memory subsystem wherein said memory subsystem comprises:

(0.1) an array of SRAM cells;

(0.2) a first parallel data accessing port operatively coupled to the SRAM array at least for independently addressing and correspondingly reading a plurality of first data bits out in parallel from the SRAM array;

(0.3) a second parallel data accessing port operatively coupled to the SRAM array for independently addressing and correspondingly reading a plurality of second data bits out in parallel from the SRAM array; and (0.4) a serial scan chain operatively coupled to the SRAM array for shifting in a plurality of supplied data bits and loading respective ones of the shifted-in data bits into respective cells of the SRAM array;

said using method comprising the steps of:

(a) loading initial data into said housed system by way of the serial scan chain for storage in the SRAM array;

(b) addressing and correspondingly reading a plurality of first, serially-loaded data bits out in parallel from the first parallel data accessing port; and (c) addressing and correspondingly reading a plurality of second, serially-loaded data bits out in parallel from the second parallel data accessing port.

* * * * *